(12) United States Patent
Hirata et al.

(10) Patent No.: US 10,782,581 B2
(45) Date of Patent: Sep. 22, 2020

(54) DISPLAY DEVICE

(71) Applicant: Panasonic Liquid Crystal Display Co., Ltd., Himeji-shi, Hyogo (JP)

(72) Inventors: Masafumi Hirata, Hyogo (JP); Hiroaki Goto, Osaka (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 59 days.

(21) Appl. No.: 16/141,476

(22) Filed: Sep. 25, 2018

(65) Prior Publication Data

US 2019/0025623 A1 Jan. 24, 2019

Related U.S. Application Data

(63) Continuation of application No. PCT/JP2017/004400, filed on Feb. 7, 2017.

(30) Foreign Application Priority Data

Mar. 29, 2016 (JP) ................................ 2016-066418

(51) Int. Cl.
 *G02F 1/1368* (2006.01)
 *H01L 27/12* (2006.01)
 (Continued)

(52) U.S. Cl.
 CPC ........ *G02F 1/1368* (2013.01); *G02F 1/13394* (2013.01); *G02F 1/136209* (2013.01);
 (Continued)

(58) Field of Classification Search
 CPC ....... G02F 2001/13396; G02F 1/13394; G02F 1/133305; H01L 27/1218
 See application file for complete search history.

(56) References Cited

U.S. PATENT DOCUMENTS

2002/0027636 A1* 3/2002 Yamada ............ G02F 1/133305
349/155
2009/0174832 A1* 7/2009 Lee ..................... G02F 1/13338
349/43

(Continued)

FOREIGN PATENT DOCUMENTS

JP 2002-072179 3/2002
JP 2009-092884 4/2009
(Continued)

*Primary Examiner* — Alia Sabur
(74) *Attorney, Agent, or Firm* — Hamre, Schumann, Mueller & Larson, P.C.

(57) ABSTRACT

A display device including a curved display surface. The display device comprises a first substrate bent in a first direction, a second substrate that is bent in the first direction, spacers disposed between the first substrate and the second substrate; and bases holding the spacers. The first substrate includes data lines and gate lines, the bases includes: a central base disposed on around a center in the first direction of the display surface; an end base disposed on around an end in the first direction of the display surface; and intermediate bases disposed between the central base and the end base in the first direction, and a width in the first direction of one of intermediate bases is larger than a width in the first direction of the central base.

12 Claims, 16 Drawing Sheets

(51) Int. Cl.
*G02F 1/1339* (2006.01)
*G02F 1/1362* (2006.01)
*G02F 1/1335* (2006.01)

(52) U.S. Cl.
CPC ...... *G02F 1/136286* (2013.01); *H01L 27/124* (2013.01); *H01L 27/1218* (2013.01); *H01L 27/1248* (2013.01); *G02F 1/133514* (2013.01); *G02F 2201/121* (2013.01); *G02F 2201/123* (2013.01)

(56) References Cited

U.S. PATENT DOCUMENTS

| | | | |
|---|---|---|---|
| 2013/0321740 A1* | 12/2013 | An | H05K 5/0217 349/58 |
| 2016/0026023 A1 | 1/2016 | Zhao et al. | |
| 2016/0313614 A1* | 10/2016 | Woo | G02F 1/136204 |
| 2016/0349561 A1 | 12/2016 | Shiina et al. | |

FOREIGN PATENT DOCUMENTS

| | | |
|---|---|---|
| JP | 2009-115933 | 5/2009 |
| JP | 2016-224298 | 12/2016 |

* cited by examiner

DISPLAY DEVICE

CROSS-REFERENCE TO RELATED APPLICATION

This application is a bypass continuation of international patent application PCT/JP2017/004400, filed on Feb. 7, 2017 designating the United States of America. Priority is claimed based on Japanese patent application JP 2016-066418, filed on Mar. 29, 2016. The entire disclosures of these international and Japanese patent applications are incorporated herein by reference in their entirety.

TECHNICAL FIELD

The present invention relates to a display device.

BACKGROUND

Recently, a liquid crystal display device having a curved display surface has been proposed (for example, see Unexamined Japanese Patent Publication No. 2009-92884). In the liquid crystal display device, a pair of substrates (a thin film transistor substrate (TFT substrate) and a color filter substrate (CF substrate)) are formed so as to be curved in a curved surface shape.

The inventors of the present invention have found that display failure occurs due to displacement between the TFT substrate and the CF substrate in the liquid crystal display device having the curved display surface. Specifically, in a process of manufacturing the liquid crystal display device, when the TFT substrate and the CF substrate bonded together are curved, stretching stress and compressive stress are applied to both the substrates, respectively and magnitude of displacement (displacement amount) between the TFT substrate and the CF substrate differs for each location in accordance with the stress distribution in a display region. Therefore, at the location where the displacement amount is large, a spacer (photo spacer) formed on the CF substrate for holding a distance (gap) between the TFT substrate and the CF substrate is not put on a base formed on the TFT substrate, so that the gap becomes nonuniform. Thus, it has been found that color mixing and light leakage occur and display unevenness is visually recognized. FIG. 16 is a diagram illustrating results of simulation on the displacement amount generated when a display panel obtained by bonding the TFT substrate and the CF substrate together is bent with a curvature radius of 500 mm. FIG. 16 illustrates the displacement amount in the case of bending the oblong display panel in the longitudinal direction (left-right direction) with both right and left ends of the display panel fixed. As illustrated in FIG. 16, it can be seen that the displacement amount is small at a center, a left end, and a right end of the display panel, and the displacement amount is large in a region between the center and the left and right ends of the display panel. According to the simulation results, the gap changes and the display unevenness becomes conspicuous in the region in which the displacement amount is larger.

The present invention has been made in view of the above circumstances, and an object thereof is to suppress degradation in display quality due to displacement between a TFT substrate and a CF substrate in a display device having a curved display surface.

SUMMARY

In one general aspect, the instant application describes a display device including a curved display surface. The display device comprises a first substrate bent in a first direction, a second substrate that is bent in the first direction and disposed opposite the first substrate, a plurality of spacers disposed between the first substrate and the second substrate; and a plurality of bases holding the plurality of spacers. The first substrate includes a plurality of data lines and a plurality of gate lines. The plurality of bases includes: a central base disposed on around a center in the first direction of the display surface; an end base disposed on around an end in the first direction of the display surface; and a plurality of intermediate bases disposed between the central base and the end base in the first direction. A width in the first direction of one of the plurality of intermediate bases is larger than a width in the first direction of the central base.

The above general aspect may include one or more of the following features. The width in the first direction of one of the plurality of intermediate bases may be larger than a width in the first direction of the end base.

In the plurality of intermediate bases, the width in the first direction may become narrower toward the center in the first direction of the display surface, and the width in the first direction may become narrower toward the end of the display surface.

With respect to a width in the first direction of each of the plurality of bases, a rate of a change in width from one of the plurality of intermediate bases in which the width in the first direction is widest to the end base may be larger than a rate of a change in width from one of the plurality of intermediate bases in which the width is widest to the central base.

The width in the first direction of the central base and the width in the first direction of the end base may be equal to each other.

Widths in a second direction of the plurality of bases may be equal to each other, the second direction different from the first direction.

The first substrate further includes: a plurality of thin film transistors arranged at intersections of the plurality of gate lines and the plurality of data lines; a plurality of pixel electrodes; and a common electrode, and each of the plurality of bases may be formed in a region where at least the gate line, a semiconductor layer constituting the thin film transistor, the data line, and the common electrode are overlapped one another in plan view.

The first substrate further includes: a plurality of thin film transistors arranged at intersections of the plurality of gate lines and the plurality of data lines; a plurality of pixel electrodes; a common electrode; and a plurality of common wirings through which a common voltage is supplied to the common electrode, and each of the plurality of bases may be formed in a region where at least the gate line, a semiconductor layer constituting the thin film transistor, the data line, the common electrode, and the common wiring overlap one another in plan view.

The second substrate may further include: a plurality of light transmission units that transmit light; and a light shielding unit that is formed around each of the plurality of light transmission units to block light transmission. The light shielding unit may include: a plurality of first light shielding portions extending in the first direction; and a plurality of second light shielding portions extending in a second direction different from the first direction, the plurality of second light shielding portions include: a central light shielding portion disposed on the center in the first direction of the display surface; an end light shielding portion disposed on the end in the first direction of the display surface; and an intermediate light shielding portion disposed between the central light shielding portion and the end light shielding portion. A width in the first direction of the intermediate light shielding portion may be larger than a width in the first direction of the central light shielding portion, and is larger than the width in the first direction of the end light shielding portion.

In another general aspect, a display device of the instant application includes a curved display surface. The display device comprises, a first substrate bent in a first direction, a second substrate that is bent in the first direction and disposed opposite the first substrate, and a plurality of spacers disposed between the first substrate and the second substrate. The first substrate includes: a plurality of data lines; a plurality of gate lines; and a plurality of thin film transistors arranged at intersections of the plurality of data lines and the plurality of gate lines. The plurality of spacers include: a central spacer disposed on a center in the first direction of the display surface; an end spacer disposed on an end in the first direction of the display surface; and an intermediate spacer disposed between the central spacer and the end spacer. The plurality of thin film transistors include: a central thin film transistor opposed to the central spacer; an end thin film transistor opposed to the end spacer; and an intermediate thin film transistor opposed to the intermediate spacer. A width in the first direction of a semiconductor layer constituting the intermediate thin film transistor is larger than a width in the first direction of a semiconductor layer constituting the central thin film transistor.

In another general aspect, a display device of the instant application includes a curved display surface. The display device comprises: a first substrate bent in a first direction; a second substrate that is bent in the first direction and disposed opposite the first substrate; and a plurality of spacers disposed between the first substrate and the second substrate. The first substrate includes, a plurality of first wirings that are one of a plurality of data lines and a plurality of gate lines, the plurality of first wirings extending in the first direction; and a plurality of second wirings that are the other of the plurality of data lines and the plurality of gate lines, the plurality of second wirings extending in a second direction orthogonal to the first direction. The plurality of spacers include: a central spacer disposed on a center in the first direction of the display surface; an end spacer disposed on an end in the first direction of the display surface; and an intermediate spacer disposed between the central spacer and the end spacer. A width in the first direction of the second wiring opposed to the intermediate spacer is larger than a width in the first direction of the second wiring opposed to the central spacer.

The above general aspect may include one or more of the following features. The first substrate further may include a plurality of thin film transistors arranged at intersections of the plurality of data lines and the plurality of gate lines. The plurality of thin film transistors may include: a central thin film transistor electrically connected to the second wiring opposed to the central spacer; and an intermediate thin film transistor electrically connected to the second wiring opposed to the intermediate spacer. A channel length of the intermediate thin film transistor may be longer than a channel length of the central thin film transistor.

With the display device according to the present invention, it is possible to suppress degradation in display quality due to displacement between a TFT substrate and a CF substrate in a display device having a curved display surface.

Embodiments of the present application are described below with reference to the drawings.

DETAILED DESCRIPTION

The embodiment of the present application takes a liquid crystal display device as an example of a display device of the present application. However, the present application is not limited thereto, but the display device may be another kind of display, such as an organic EL display.

Figure 1:
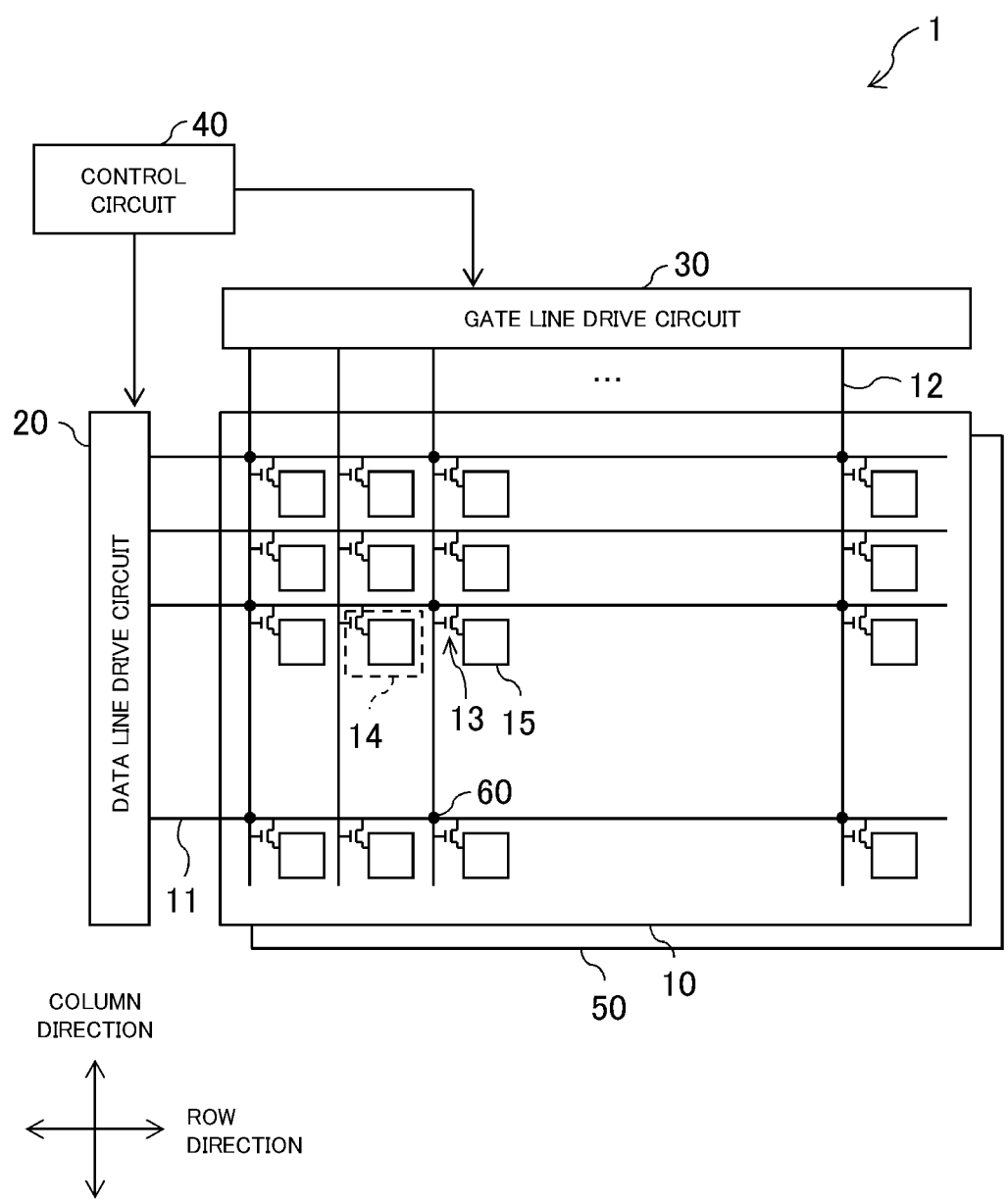
FIG. 1 is a diagram illustrating a schematic configuration of a liquid crystal display device according to the present exemplary embodiment.

FIG. 1 is a diagram illustrating a schematic configuration of a liquid crystal display device according to the present exemplary embodiment. Liquid crystal display device 1 includes display panel 10 for displaying an image, a drive circuit (data line drive circuit 20, gate line drive circuit 30, and the like) that drives display panel 10, control circuit 40 for controlling the drive circuit, and backlight device 50 that irradiates display panel 10 with light from the back surface side of display panel 10. The drive circuit may be provided on display panel 10.

Figure 2:
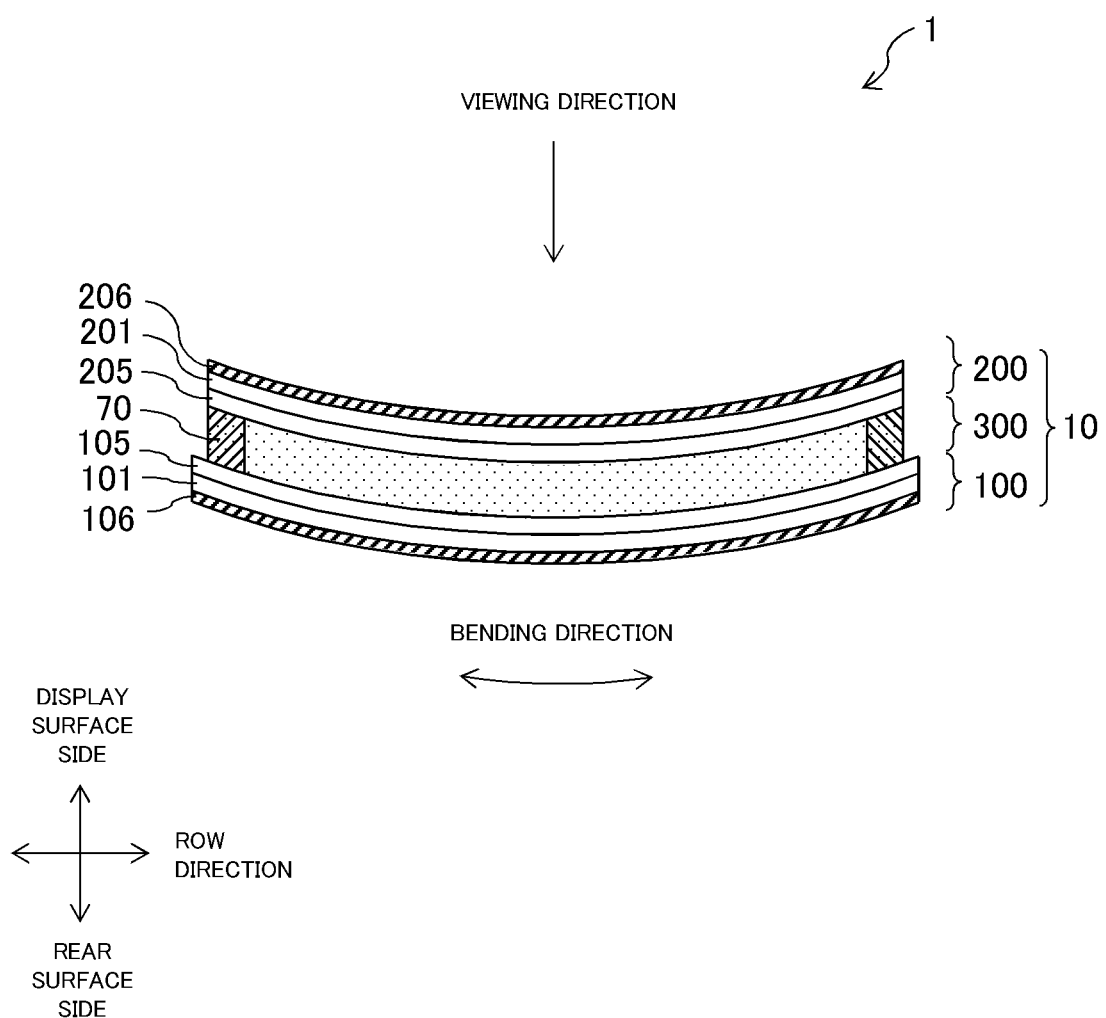
FIG. 2 illustrates a cross-sectional view of the liquid crystal display device according to the present exemplary embodiment.
Figure 3:
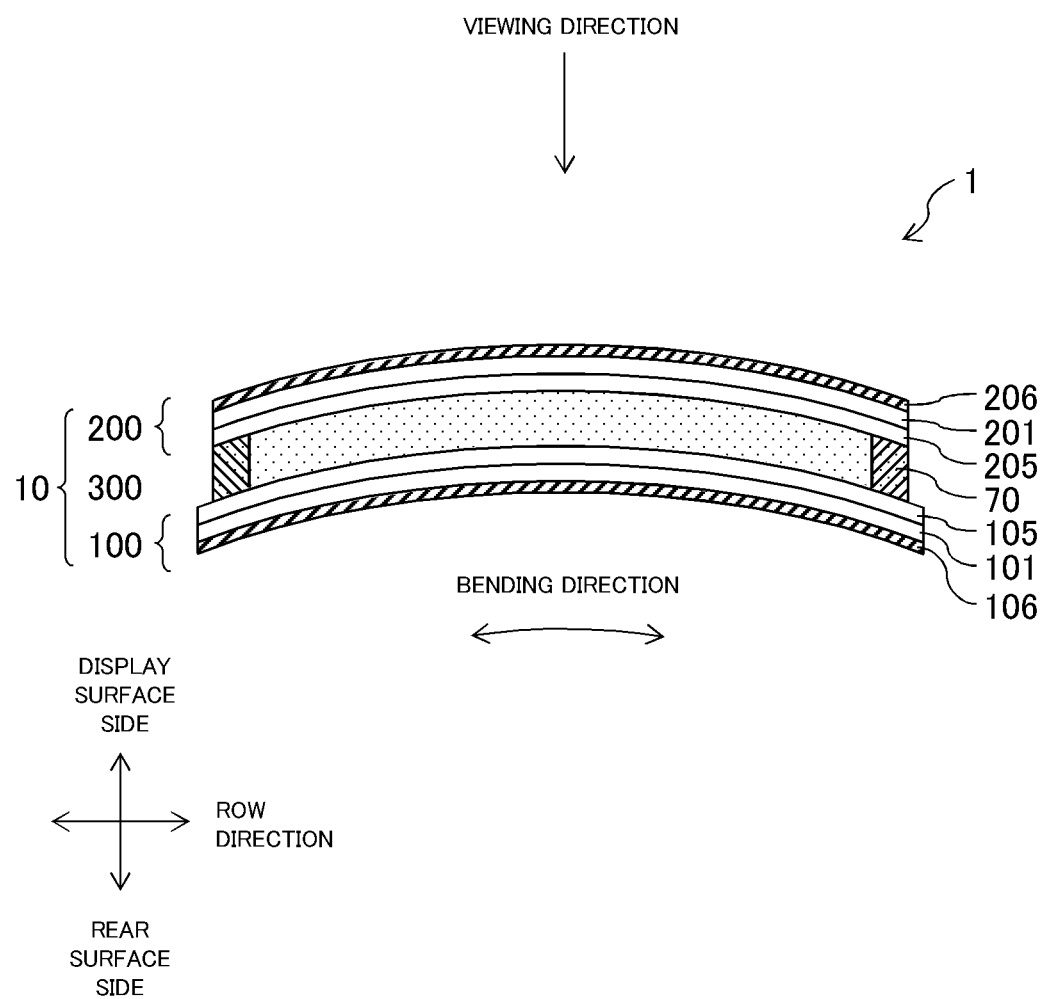
FIG. 3 illustrates a cross-sectional view of the liquid crystal display device according to the present exemplary embodiment.

As illustrated in FIG. 2, liquid crystal display device 1 has a curved outer shape curved such that a display-side surface becomes concave and a back-side surface becomes convex. As illustrated in FIG. 3, alternatively, liquid crystal display device 1 has a curved outer shape curved such that the display-side surface becomes convex and the back-side surface side becomes concave. In liquid crystal display device 1 illustrated in FIG. 2, stretching stress is applied to glass substrate 101 constituting a thin film transistor substrate (TFT substrate 100), and compressive stress is applied to glass substrate 201 constituting a color filter substrate (CF substrate 200). In liquid crystal display device 1 illustrated in FIG. 3, compressive stress is applied to glass substrate 101 constituting TFT substrate 100, and stretching stress is applied to glass substrate 201 constituting CF substrate 200. As described later in details, liquid crystal layer 300 is disposed between TFT substrate 100 and CF substrate 200, and TFT substrate 100 and CF substrate 200 are bonded and fixed to each other by a seal with liquid crystal layer 300 sandwiched therebetween. Further, spacers are disposed between TFT substrate 100 and CF substrate 200 to keep a distance (gap) between the two substrates constant.

Reverting to FIG. 1, a plurality of data lines 11 extending in a row direction and a plurality of gate lines 12 extending in a column direction are provided on display panel 10. Thin film transistor 13 (TFT) is provided on an intersection between each data line 11 and each gate line 12. Each data line 11 and each gate line 12 are formed in a shape (convex) which is curved in accordance with a bending direction of liquid crystal display device 1. The bending direction is a direction horizontal to the display surface, and refers, for example, to the row direction or the column direction. For example, in the case where the bending direction is the row direction (see FIG. 4), each gate line 12 is formed in a linear shape, and each data line 11 is formed in a curved shape. In the case where the bending direction is the column direction (refer to FIG. 5 described later), each gate line 12 is formed in a curved shape, and each data line 11 is formed in a linear line.

On display panel 10, a plurality of pixels 14 are arranged in a matrix form (row direction and column direction) so as to correspond to the respective intersections between data lines 11 and gate lines 12. On TFT substrate 100 of display panel 10, a plurality of pixel electrodes 15 which are provided so as to correspond to pixels 14 respectively, and one common electrode 16 (see FIG. 9 and the like) common to all the pixels 14 are provided. Common electrode 16 may be divided and arranged in corresponding to one pixel 14 or a plurality of pixels 14. As described later in details, on TFT substrate 100, base 60 which is in contact with the spacer is disposed around an intersection between each data line 11 and each gate line 12.

Control circuit 40 outputs various kinds of control signals for controlling drive timing of data line drive circuit 20 and gate line drive circuit 30, and image data corresponding to an image to be displayed on a display region of display panel 10, based on input data (e.g., a synchronization signal, a video signal) from the outside.

Data line drive circuit 20 outputs a data signal (data voltage) to each data line 11, based on the control signal and the image data received from control circuit 40.

Gate line drive circuit 30 generates a gate signal (gate voltage) based on a power supply voltage received from outside display panel 10 and the control signal received from control circuit 40, and outputs the gate signal to each gate line 12.

Figure 6:
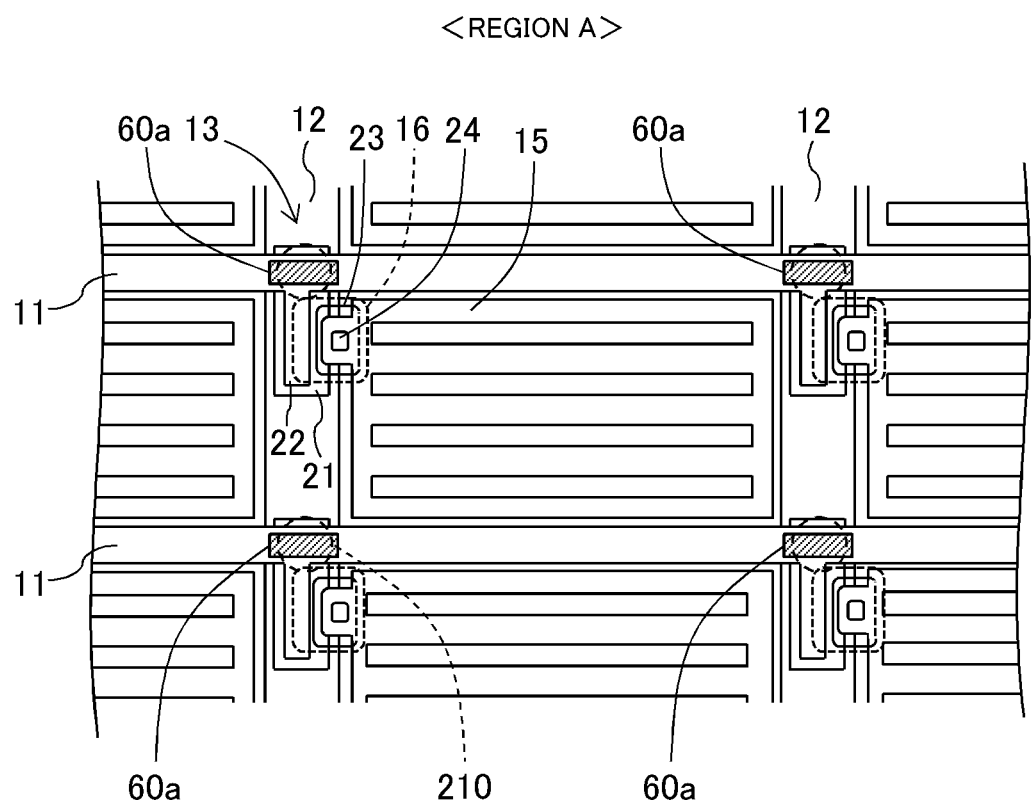
FIG. 6 is a plan view illustrating a schematic configuration of each pixel arranged in a region A on display panel according to the present exemplary embodiment.
Figure 6:
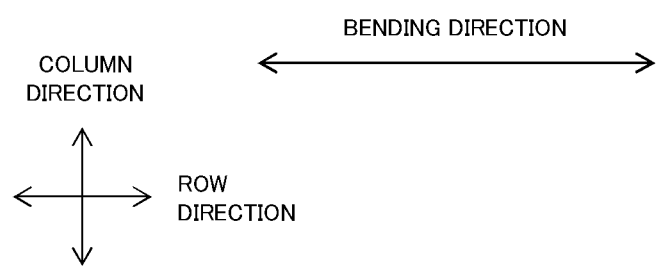
Figure 7:
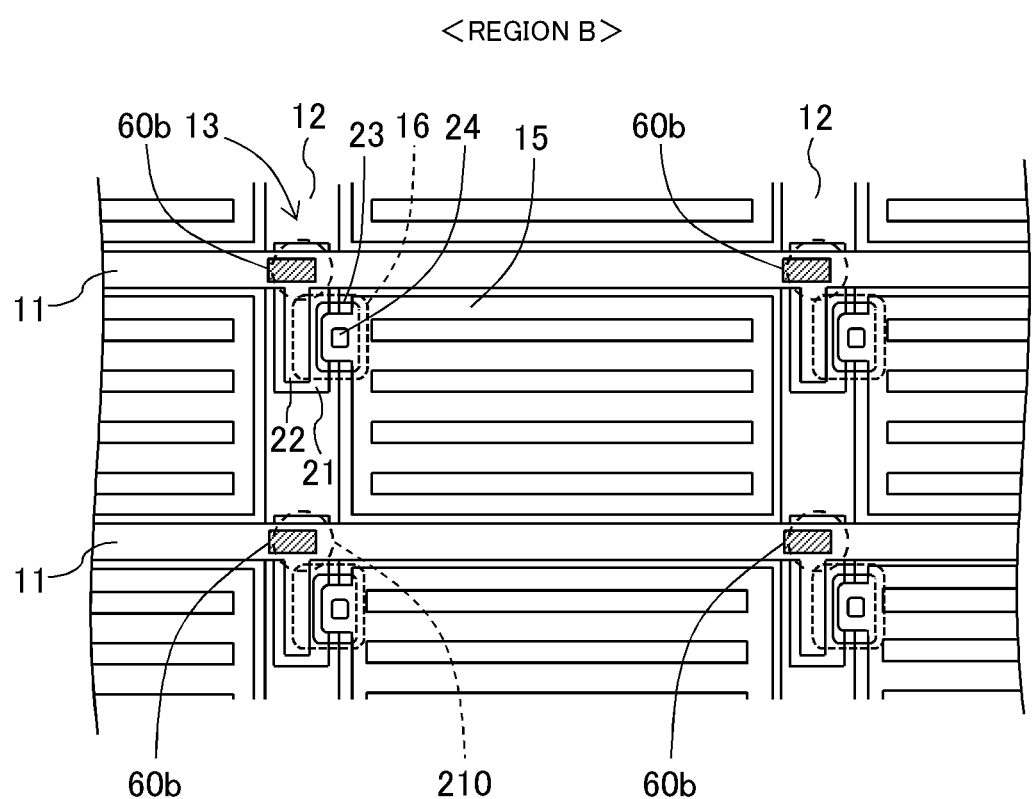
FIG. 7 is a plan view illustrating a schematic configuration of each pixel arranged in a region B on display panel according to the present exemplary embodiment.
Figure 16:
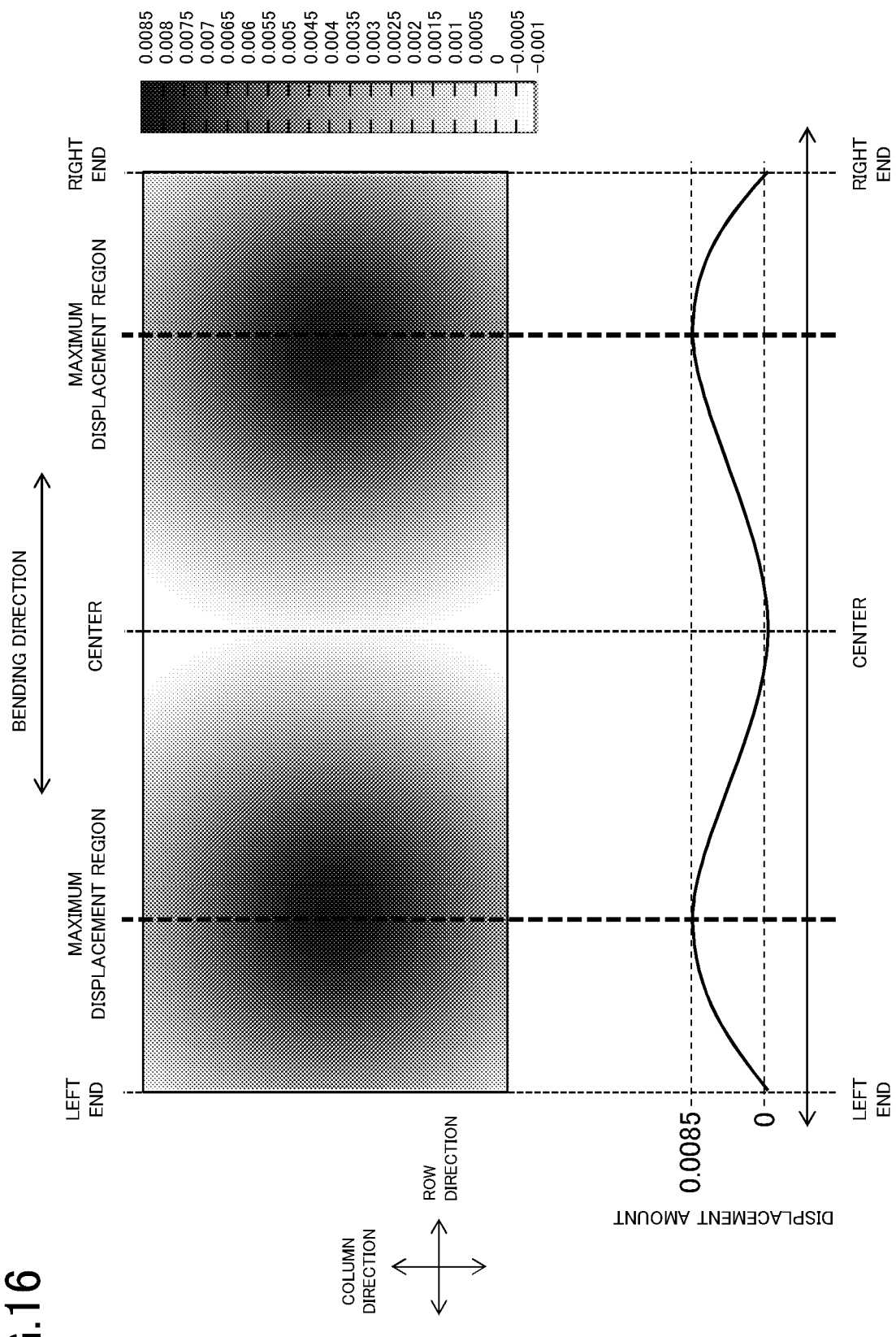
FIG. 16 is a diagram illustrating results of simulation on the displacement amount generated, when a display panel obtained by bonding the TFT substrate and the CF substrate together is bent.

FIG. 6 is a plan view illustrating a schematic configuration of each pixel 14 on display panel 10. FIG. 6 illustrates pixels 14 arranged in a region (region A) where a displacement amount illustrated in FIG. 16 is large. FIG. 7 illustrates pixels 14 arranged in a region (region B) where the displacement amount illustrated in FIG. 16 is small.

In FIGS. 6 and 7, a region defined by two adjacent data lines 11 and two adjacent gate lines 12 corresponds to one pixel 14. On each pixel 14, TFT 13 is provided. TFT 13 includes semiconductor layer 21 formed on insulating film 102 (see FIG. 9 and the like), and drain electrode 22 and source electrode 23 each formed on semiconductor layer 21. Drain electrode 22 is electrically connected to data line 11, and source electrode 23 is electrically connected to pixel electrode 15 through through-hole 24.

On each pixel 14, pixel electrode 15 as a transparent conductive film made of, for example, indium tin oxide (ITO) is formed. Pixel electrode 15 has a plurality of openings (slits) and is formed in a stripe shape. The shape of each opening is not limited. In common to pixels 14, one common electrode 16 as a transparent conductive film made of, for example, ITO is formed in an entire display region. In common electrode 16, an opening (corresponding to a region surrounded with a dotted line in FIGS. 6 and 7) for electrically connecting pixel electrode 15 to source electrode 23 is formed in a region that overlaps through-hole 24 and source electrode 23 of TFT 13.

Figure 8:
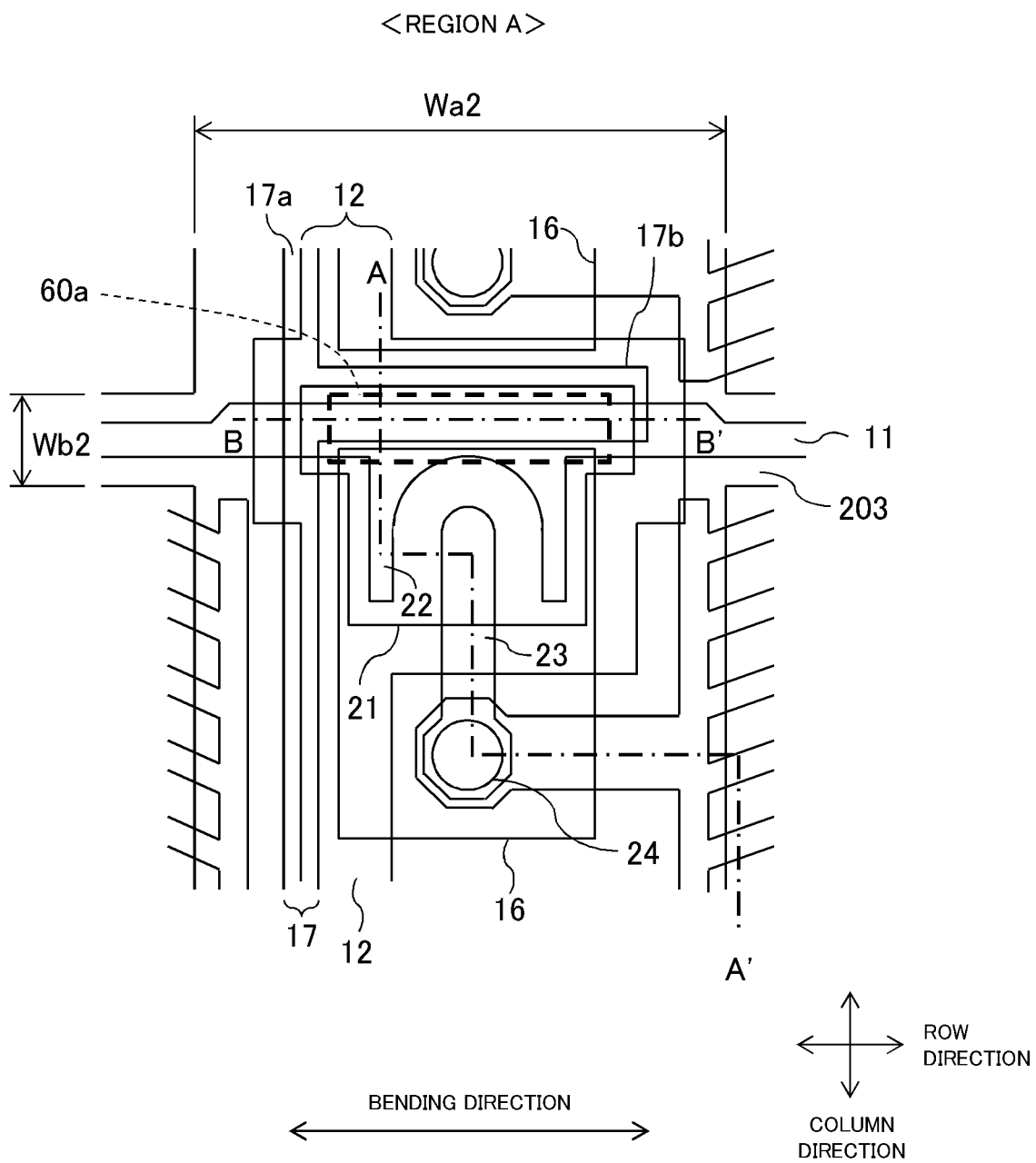
FIG. 8 is an enlarged plan view of a peripheral region of TFT arranged in region A illustrated in FIG. 6.
Figure 9:
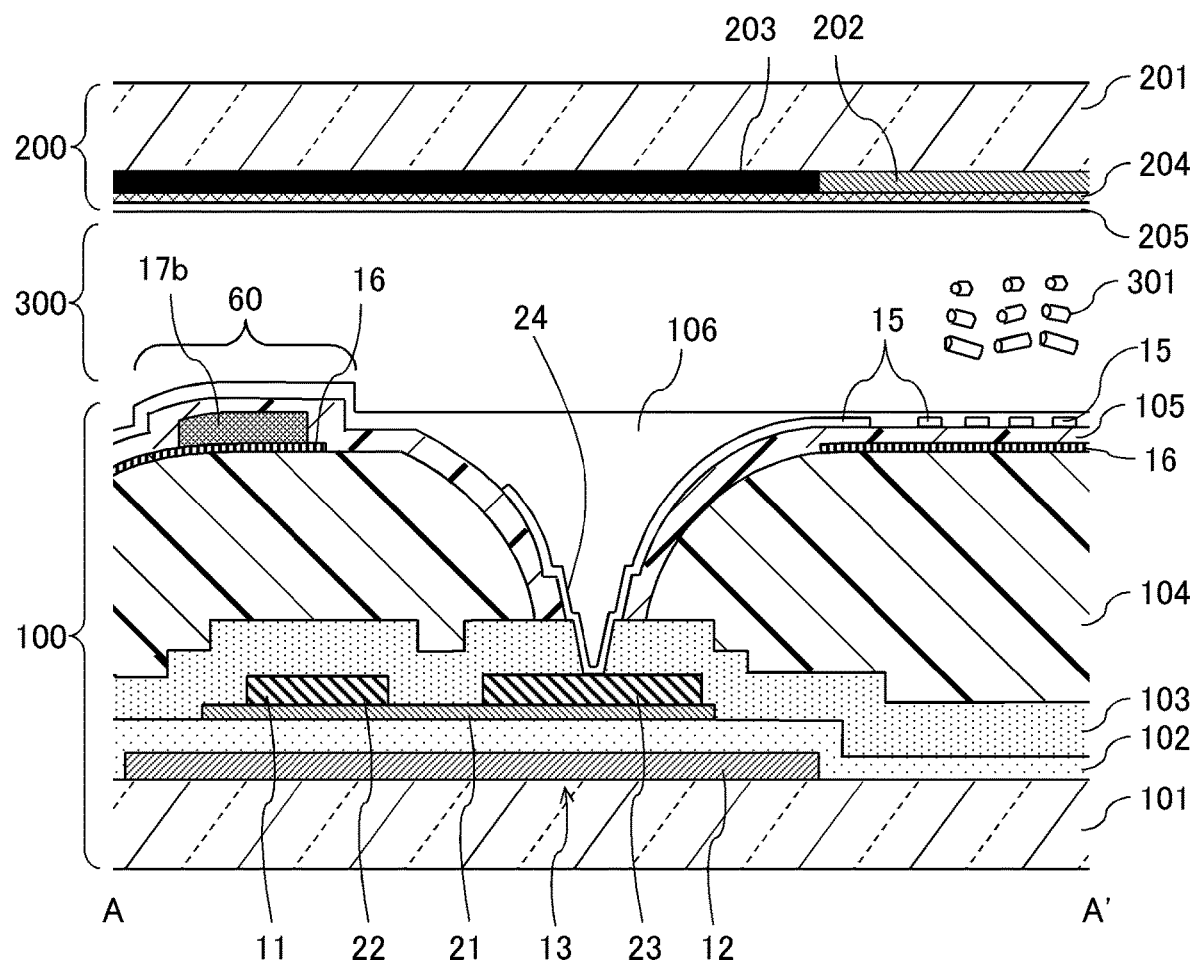
FIG. 9 is a sectional view taken along line A-A' in FIG. 8.
Figure 10:
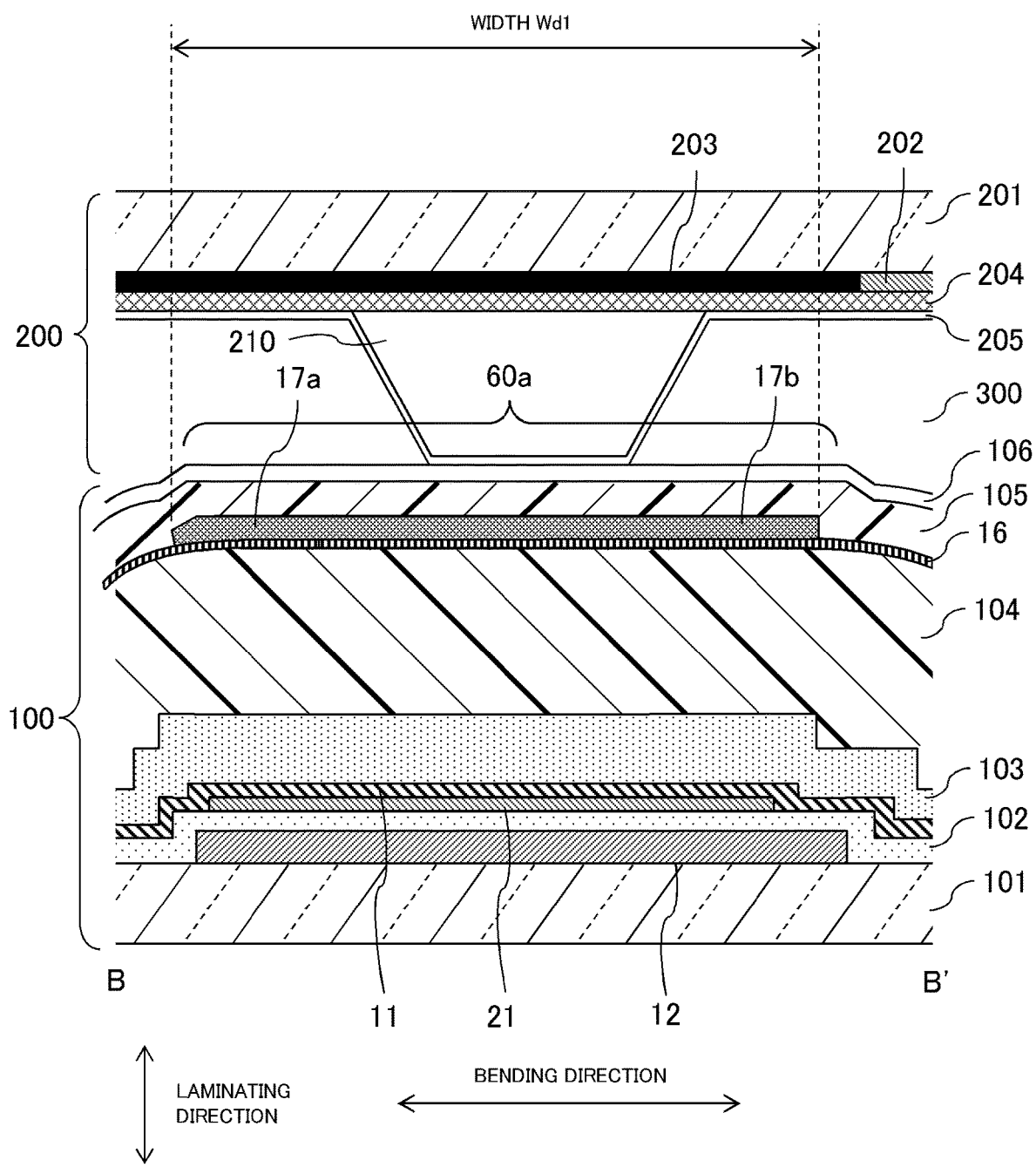
FIG. 10 is a sectional view taken along line B-B' in FIG. 8.

FIG. 8 is an enlarged plan view of a peripheral region of TFT 13 arranged in region A illustrated in FIG. 6. FIG. 9 is a sectional view taken along line A-A' in FIG. 8, and FIG. 10 is a sectional view taken along line B-B' in FIG. 8.

As illustrated in FIG. 9, display panel 10 includes TFT substrate 100, CF substrate 200, and liquid crystal layer 300 sandwiched between TFT substrate 100 and CF substrate 200.

In TFT substrate 100, gate lines 12 are formed on glass substrate 101, and insulating film 102 is formed so as to cover gate lines 12. Semiconductor layer 21 is formed on insulating film 102. Data line 11, drain electrode 22, and source electrode 23 are formed on semiconductor layer 21. Insulating film 103 is formed so as to cover them. Organic insulating film 104 is formed on insulating film 103. Common electrode 16 is formed on organic insulating film 104. Common wire 17 is formed on common electrode 16. As illustrated in FIG. 8, common wire 17 includes first portion 17a extending in the column direction between pixels 14 adjacent to each other in the row direction, and second portion 17b extending from first portion 17a in the row direction between pixels 14 adjacent to each other in the column direction. Insulating film 105 is formed so as to cover common electrode 16 and common wire 17. As illustrated in FIG. 9, through-hole 24 is formed in insulating film 103, organic insulating film 104, and insulating film 105 each located above source electrode 23. Pixel electrode 15 is formed on insulating film 105 and in through-hole 24. Alignment film 106 is formed so as to cover pixel electrode 15. Accordingly, pixel electrode 15 and source electrode 23 are electrically connected to each other. A polarizing plate (not illustrated) is attached to a surface (back surface), on a backlight device 50 side (opposite side to liquid crystal layer 300 side), of glass substrate 101. Further, base 60 is formed on TFT substrate 100. A specific structure of base 60 will be described later.

CF substrate 200 is formed with light transmission units 202 that are disposed so as to correspond to each pixel 14 and transmit predetermined light, and black matrix 203 that blocks the transmission of light. The light transmission units 202 include, for example, a red light transmission unit formed with a red colored portion (red portion) for transmitting red light, a green light transmission unit formed with a green colored portion (green portion) for transmitting green light, and a blue light transmission unit formed with a blue colored portion (blue portion) for transmitting blue light. A layout of the light transmission units (colored portions) may be a vertical stripe layout in which the red light transmission unit, the green light transmission unit, and the blue light transmission unit are repeatedly arranged in this order in the column direction and the light transmission units of the same color are arranged in the row direction, or may be a lateral stripe layout in which the red light transmission unit, the green light transmission unit, and the blue light transmission unit are repeatedly arranged in this order in the row direction, and the light transmission units of the same color are arranged in the column direction. Black matrix 203 is formed in a region (boundary) between the light transmission units 202 that are adjacent to each other in the row direction and the column direction.

Overcoat layer 204 is formed so as to cover light transmission units 202 and black matrix 203. Spacer 210 is formed on overcoat layer 204, and alignment film 205 is formed so as to cover spacer 210. Spacer 210 is formed so as to overlap black matrix 203 in plan view. Spacer 210 is formed such that at least a part of the surface, on the TFT substrate 100 side, of spacer 210 has a height which is in contact with a surface of base 60 in a normal operating state. Spacer 210 may include a sub-spacer which is not in contact with the surface of base 60 in the normal operating state. Spacer 210 and base 60 may be provided in one or more ratios with respect to one pixel including a red pixel, a blue pixel, and a green pixel, or may be provided in one ratio with respect to some pixels. Examples of a shape of spacer 210 may include a columnar shape, a prismatic shape, and a conical shape. In FIG. 9, spacer 210 is omitted. A polarizing plate (not illustrated) is attached to a surface (front surface), on a display surface side (opposite side to liquid crystal layer 300 side), of glass substrate 201.

Liquid crystal 301 is sealed in liquid crystal layer 300. Liquid crystal 301 may be a negative type liquid crystal of which the dielectric anisotropy is negative, or may be a positive type liquid crystal of which the dielectric anisotropy is positive. Alignment films 105, 205 each may be an alignment film subjected to rubbing alignment treatment or an optical alignment film subjected to optical alignment treatment.

Figure 11:
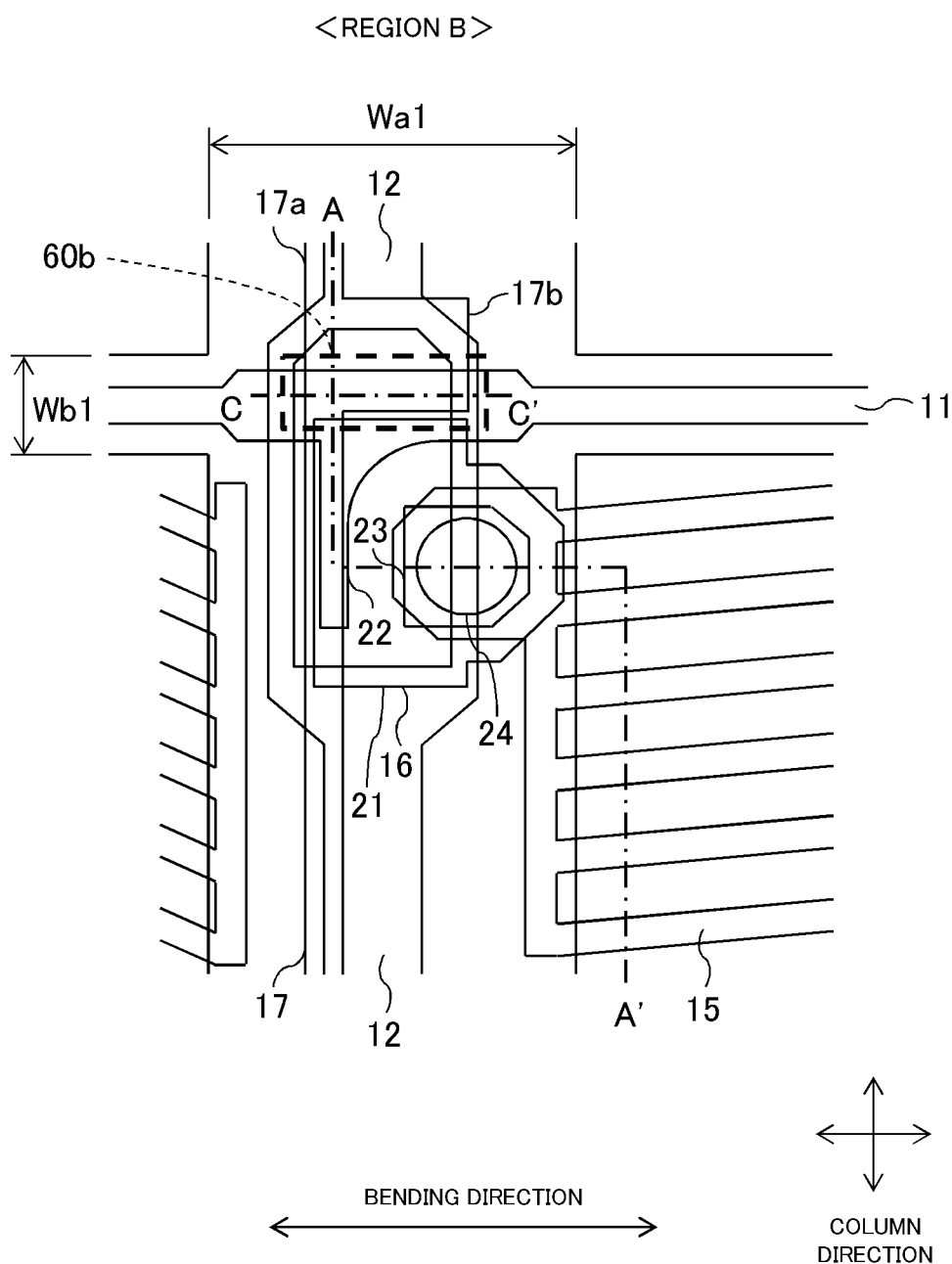
FIG. 11 is an enlarged plan view of a peripheral region of TFT arranged in region B illustrated in FIG. 7.
Figure 12:
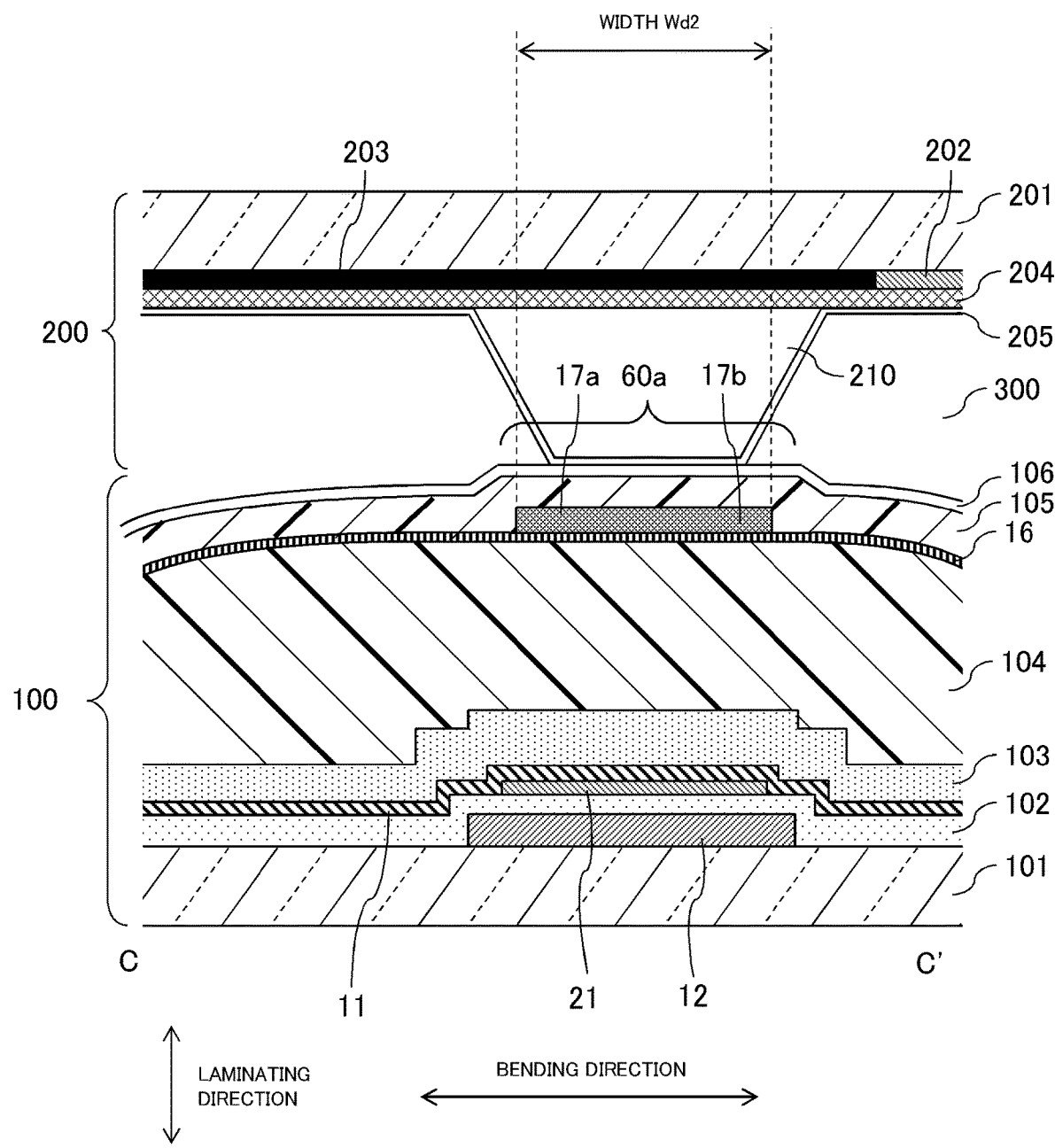
FIG. 12 is a sectional view taken along line C-C in FIG. 11.

FIG. 11 is an enlarged plan view of a peripheral region of TFT 13 arranged in region B illustrated in FIG. 7. FIG. 12 is a sectional view taken along line C-C' in FIG. 11. A sectional structure taken along line A-A' in FIG. 11 is similar to the sectional structure illustrated in FIG. 9; therefore, the description thereof will not be given here. Hereinafter, a specific configuration of base 60 will be described here with reference FIGS. 8 and 10 corresponding to region A and FIGS. 11 and 12 corresponding to region B.

Figure 13:
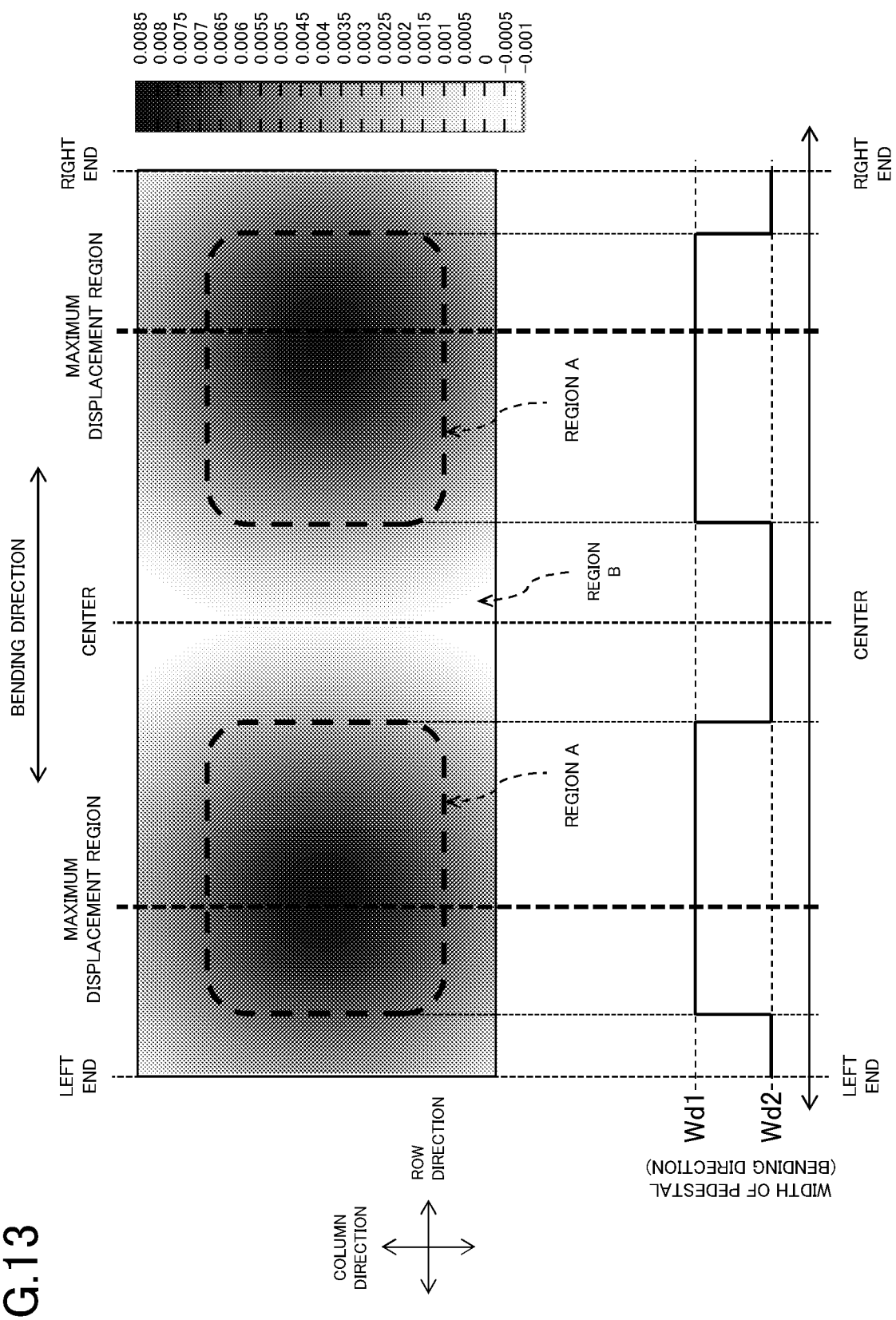
FIG. 13 is a graph illustrating a relationship between a width of a base and an amount of displacement according to the present exemplary embodiment.

Base 60 is formed in the vicinity of TFT 13 of TFT substrate 100. In TFT substrate 100, base 60 is formed in a region of a step portion that protrudes toward liquid crystal layer 300, at a position facing spacer 210 formed on CF substrate 200. Base 60 is formed in a region where gate lines 12, semiconductor layer 21, data lines 11, common electrode 16, and common wire 17 are superimposed in plan view. Base 60 according to the present exemplary embodiment includes first base 60a (see FIGS. 8 and 10) formed in region A, and second base 60b (see FIGS. 11 and 12) formed in region B. Width Wd1 (see FIG. 10) of first base 60a in the bending direction is set to be wider than width Wd2 (see FIG. 12) of second base 60b in the bending direction. That is, as illustrated in a graph of FIG. 13, width Wd1 of first base 60a, in the bending direction (row direction in the present exemplary embodiment), arranged in region A where the displacement amount is large and width Wd2 of second base 60b, in the bending direction (row direction in the present exemplary embodiment), arranged in region B where the displacement amount is small are set so as to satisfy Wd1>Wd2. Width Wd2 of second base 60b on the center of display panel 10 and width Wd2 of second base 60b on the left and right ends may be equal to each other. In addition, widths of bases 60 in a direction orthogonal to the bending direction (column direction in the present exemplary embodiment) may be equal to each other. Alternatively, similar to the width in the row direction, the width of first base 60a, in the column direction, arranged in region A where the displacement amount is large may be larger than the width of second base 60b, in the row direction, arranged in region B where the displacement region is small.

According to the above configuration, in region A where the displacement amount is large, the wide width of base 60a in the displacement direction prevents spacer 210 from falling off base 60a. Therefore, it is possible to hold the distance (gap) between TFT substrate 100 and CF substrate 200, and it is therefore possible to suppress display unevenness due to the change in gap. In region B where the displacement amount is small, the width of second base 60b is smaller than the width of first base 60a, and the widths of all bases 60 are not wide. It is therefore possible to prevent a numerical aperture from decreasing.

Figure 14:
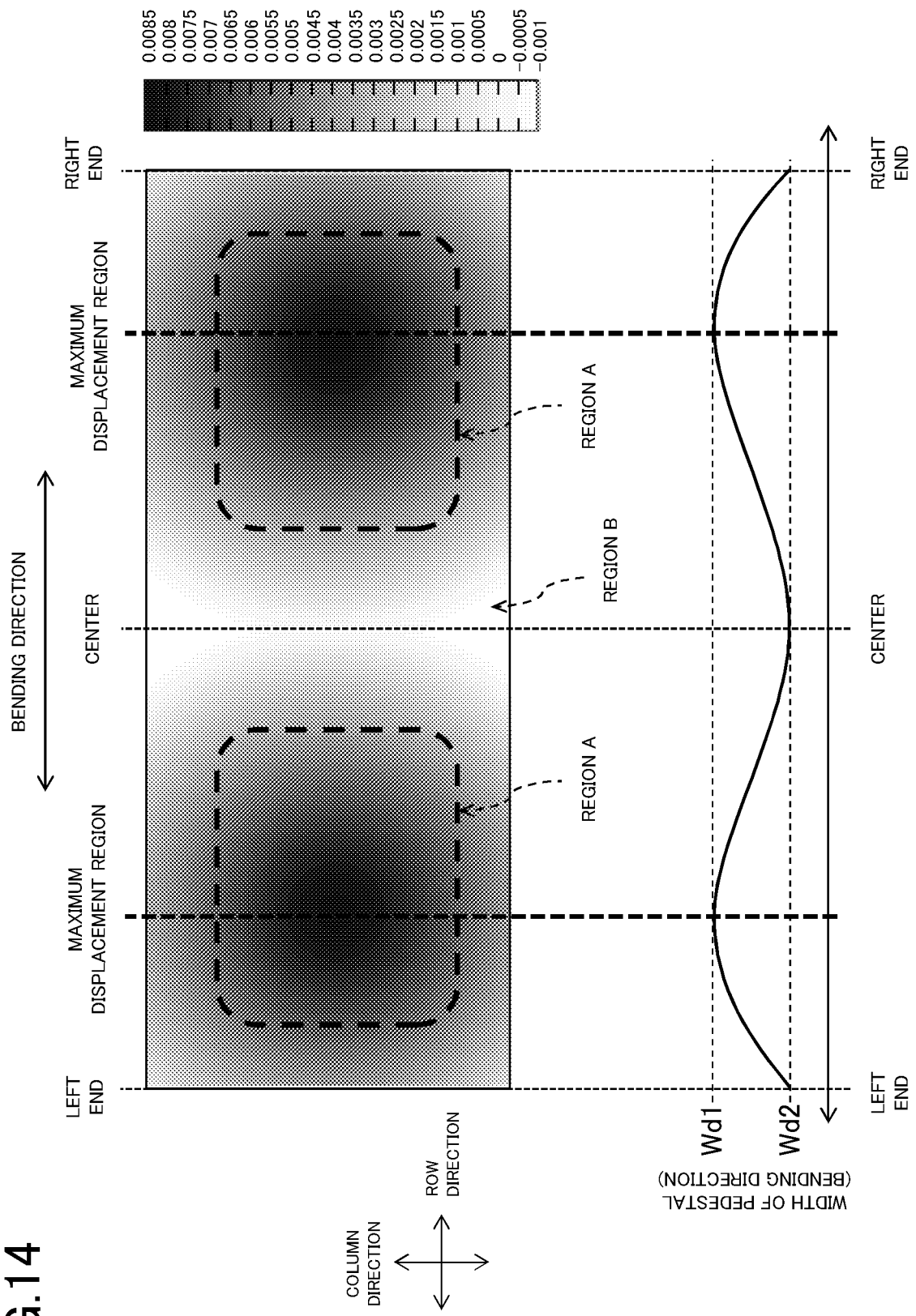
FIG. 14 is a graph illustrating a relationship between a width of a base and an amount of displacement according to the present exemplary embodiment.

In the above configuration, the widths of bases 60 are set to two kinds Wd1, Wd2, but are not limited thereto. Widths Wd of bases 60 in the bending direction of liquid crystal display device 1 may be set to differ depending on the displacement amount. Specifically, as illustrated in FIG. 14, width Wd of base 60 that is closest to the region where the displacement amount becomes the maximum may be set to the maximum value, and width Wd of base 60 may be set narrower as the portion becomes closer to the left end and the center from the maximum displacement region. As illustrated in FIG. 16, a rate of change in displacement amount from the maximum displacement region to the end (left end, right end) is larger than the rate of change in displacement amount from the maximum displacement region to the center, in the left and right regions of the display panel. Therefore, widths Wd of bases 60 may be set in accordance with the above rate. More specifically, regarding widths Wd of bases 60, the rate of change in width Wd from first base 60a of which width Wd is the maximum to second base 60b disposed at the end is set to be larger than the rate of change in width Wd from first base 60a to second base 60b disposed at the center.

Figure 15:
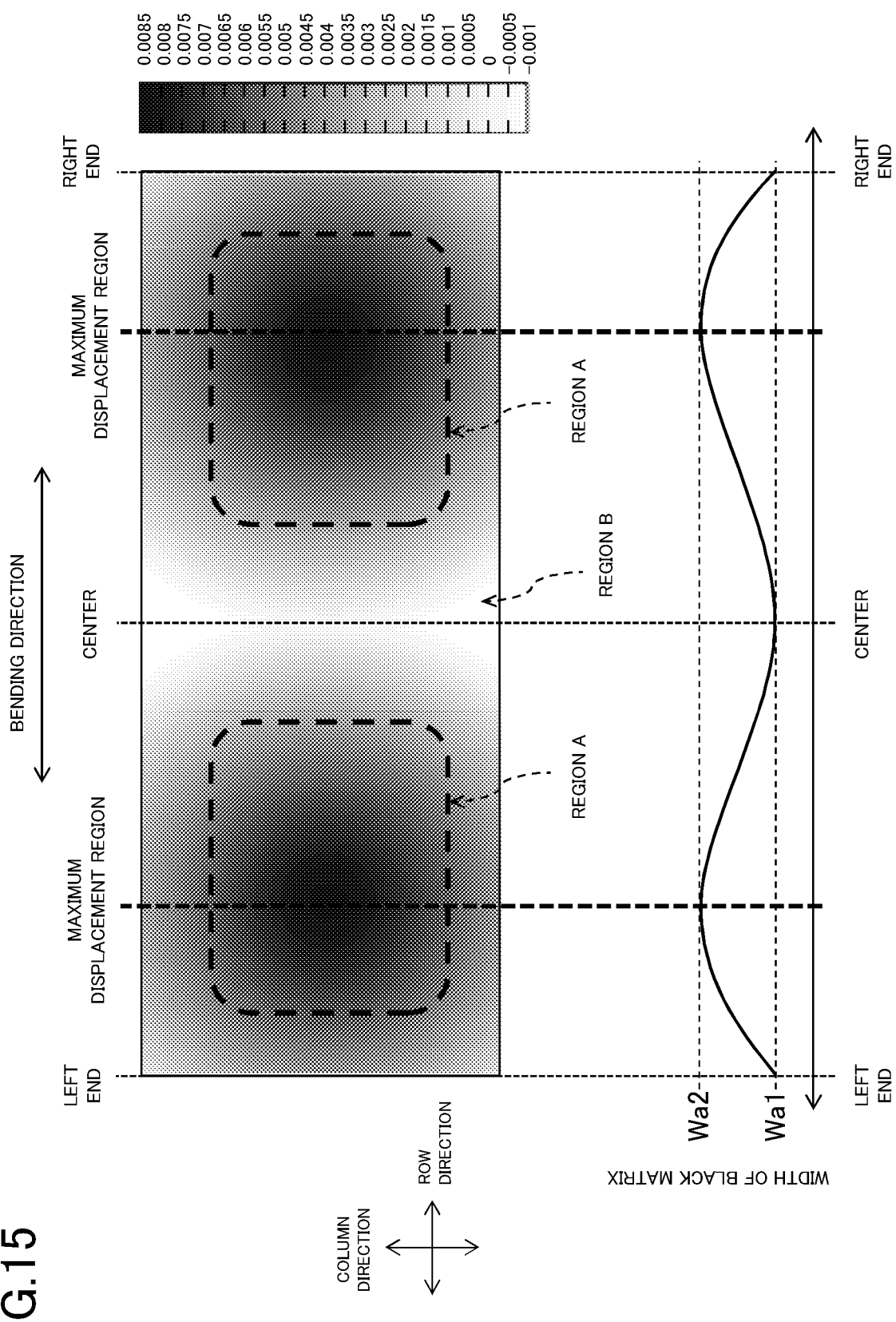
FIG. 15 is a graph illustrating a relationship between a width of a black matrix and an amount of displacement according to the present exemplary embodiment.

Liquid crystal display device 1 according to the present exemplary embodiment is not limited to the above configuration. For example, regarding black matrix 203 formed on CF substrate 200, the width, in the row direction, of the column portion extending in the column direction perpendicular to the bending direction of liquid crystal display device 1 may be set to be differ in region A and region B. Specifically, width Wa2 (see FIG. 8), in the bending direction (row direction in the present exemplary embodiment), of black matrix 203 arranged in region A where the displacement amount is large and the width Wa1 (see FIG. 11), in the bending direction (row direction in the present exemplary embodiment), of black matrix 203 arranged in region B where the displacement region is small may be set so as to satisfy Wa2>Wa1. Regarding the width of black matrix 203, as illustrated in FIG. 15, the width of the column portion that is closest to the region where the displacement amount becomes the maximum (maximum displacement region in FIG. 16) may be set to the maximum value Wa2, and the width of the column portion may be set narrower as the portion becomes closer to the left end and the center from the maximum displacement region. The rate of change in width of base 60 and the rate of change in width of black matrix 203 may be set to be the same. According to the configuration of black matrix 203, color mixing and light leakage that may be caused by displacement of TFT substrate 100 and CF substrate 200 can be suppressed. Since black matrix 203 has a width corresponding to the displacement amount, a numerical aperture ratio does not decrease more than necessary. Width Wb2 (see FIG. 8), in the direction (column direction in the present exemplary embodiment) perpendicular to the bending direction, of black matrix 203 arranged in region A where the displacement amount is large and the width Wb1 (see FIG. 11), in the direction (row direction in the present exemplary embodiment) perpendicular to the bending direction, of black matrix 203 arranged in region B where the displacement region is small may also be set so as to satisfy Wb2>Wb1.

Figure 4:
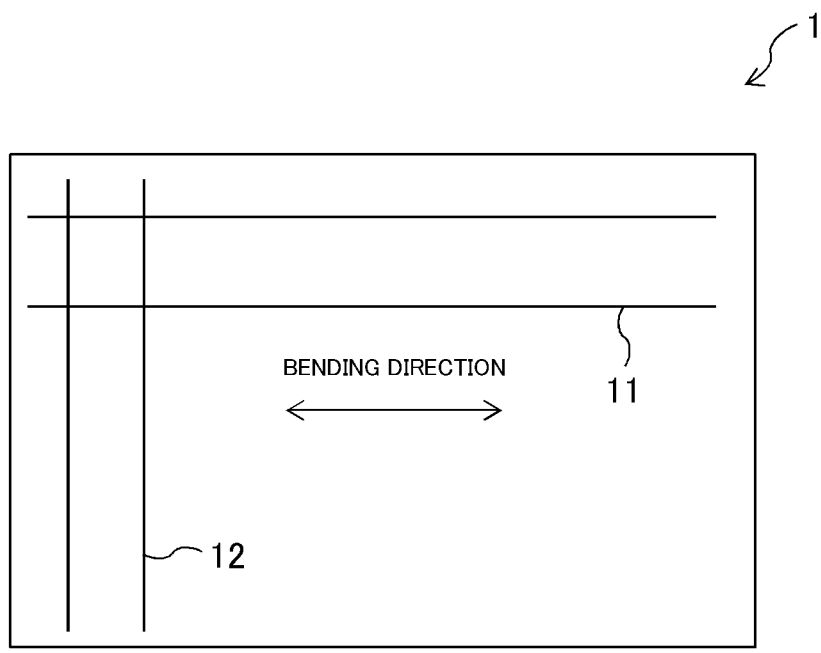
FIG. 4 illustrates a bending direction in the liquid crystal display device according to the present exemplary embodiment.
Figure 4:
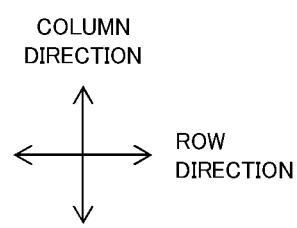
Figure 5:
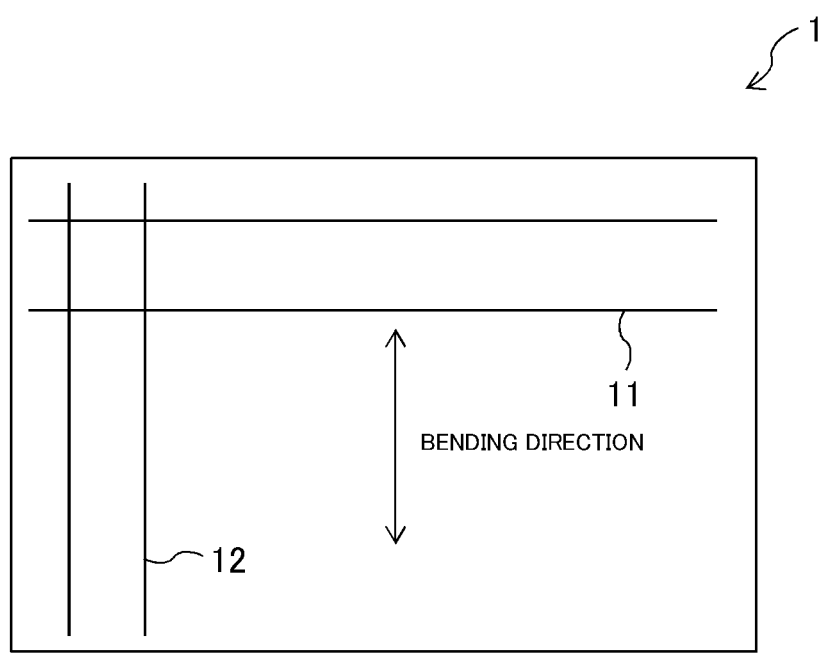
FIG. 5 illustrates another bending direction in the liquid crystal display device according to the present exemplary embodiment.
Figure 5:
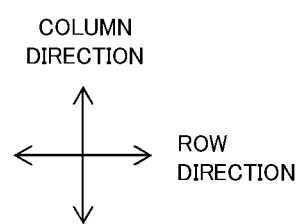

In the above configuration, the bending direction is the row direction (see FIG. 4). In the case where the bending direction is the column direction (see FIG. 5), the width of base 60 in the column direction may be set to differ in accordance with the displacement amount (see FIG. 16). In other words, the width, in the column direction, of the region, where gate lines 12, semiconductor layer 21, data lines 11, common electrodes 16, and common wire 17 are superimposed, constituting base 60 in plan view may be formed in accordance with the displacement amount (see FIG. 16). Moreover, regardless of the bending direction, both the width of base 60 in the row direction and the width of base 60 in the column direction may be set to be different from each other in accordance with the displacement amount (see FIG. 16).

In the above configuration, common wire 17 is formed on common electrode 16. Alternatively, common wire 17 may be omitted. In this case, base 60 is formed in a region where gate lines 12, semiconductor layer 21, data lines 11, and common electrode 16 are superimposed in plan view.

Here, the spacers 210 include a central spacer disposed on a center in a the bending direction of the display surface, an end spacer disposed on an end of the display surface in the bending direction, and intermediate spacers disposed between the central spacer the end spacer. The TFTs 13 include a central TFT facing (opposed) the central spacer, an end TFT facing (opposed) the end spacer, and an intermediate TFT facing (opposed) the intermediate spacer.

As described above, base 60 is formed in a region where at least gate line 12, semiconductor layer 21, data lines 11, and common electrode 16 are superimposed in plan view. In other words, base 60 includes as its constituent elements at least gate line 12, semiconductor layer 21, data line 11, and common electrode 16. Therefore, for example, regarding semiconductor layer 21 of base 60, the width, in the bending direction (row direction in the present exemplary embodiment), of semiconductor layer 21 of the intermediate TFT arranged in region A where the displacement amount is large is set to be larger than the width, in the bending direction (row direction in the present exemplary embodiment), of semiconductor layer 21 of the central TFT arranged in region B where the displacement region is small. Further, for example, when attention is paid to gate line 12 of base 60, the width, in the bending direction (row direction in the present exemplary embodiment), of gate line 12 facing (opposed) the intermediate spacer arranged in region A where the displacement amount is large is set to be larger than the width, in the bending direction (row direction in the present exemplary embodiment), of gate line 12 facing (opposed) the central spacer arranged in region B where the displacement region is small. In the case where the bending direction is the column direction (see FIG. 5), regarding data line 11 of base 60, the width, in the bending direction (column direction in the present exemplary embodiment), of data line 11 facing (opposed) the intermediate spacer arranged in region A where the displacement amount is large is set to be larger than the width, in the bending direction (column direction in the present exemplary embodiment), of data line 11 facing (opposed) the central spacer arranged in region B where the displacement region is small.

In liquid crystal display device 1 according to the present exemplary embodiment, as described above, for example, a size of TFT 13 may be set to differ in accordance with regions A and B. Specifically, a channel length of the intermediate TFT may be set to be longer than the channel length of the central TFT.

Liquid crystal display device 1 has a configuration of a lateral electric field mode in which an electric field substantially parallel to TFT substrate 100 and CF substrate 200 is applied to liquid crystal layer 300. Liquid crystal display device 1 has, for example, a configuration of an IPS (In Plane Switching) method. Liquid crystal display device 1 is not limited to the lateral electric field mode and may have, for example, a configuration of a VA (Vertical Alignment) mode.

Finally, a driving method for liquid crystal display device 1 will be briefly described. To gate line 12, a gate voltage for scanning (gate-on voltage, gate-off voltage) is supplied from gate line drive circuit 30. To data line 11, a data voltage for video is supplied from data line drive circuit 20. When a gate-on voltage is supplied to gate line 12, TFT 13 is turned on, and the data voltage supplied to data line 11 is transmitted to pixel electrode 15 via drain electrode 22 and source electrode 23. To common electrode 16, a common voltage (Vcom) is supplied from a common electrode drive circuit (not illustrated). Common electrode 16 overlaps with pixel electrode 15 through insulating film 104, and openings (slits) are formed in pixel electrode 15. Liquid crystal 301 in the liquid crystal layer 300 is driven by an electric field from pixel electrode 15 to common electrode 16 through the openings of pixel electrode 15. An image is displayed by driving liquid crystal 301 and controlling the transmittance of light passing through liquid crystal layer 300. The driving method for liquid crystal display device 1 is not limited to the above-described method, and methods known in the art can be applied.

While there have been described what are at present considered to be certain embodiments of the application, it will be understood that various modifications may be made thereto, and it is intended that the appended claims cover all such modifications as fall within the true spirit and scope of the invention.

What is claimed is:

1. A display device including a curved display surface, the display device comprising:
   a first substrate bent in a first direction;
   a second substrate that is bent in the first direction and disposed opposite the first substrate;
   a plurality of spacers disposed between the first substrate and the second substrate; and a plurality of bases holding the plurality of spacers,
wherein the first substrate includes a plurality of data lines and a plurality of gate lines,
each of the plurality of bases is present at a region of a step portion that protrudes toward the second substrate, with each of the plurality of bases facing a respective one of the spacers,
the plurality of bases includes: a central base disposed on a center in the first direction of the display surface; an end base disposed on an end in the first direction of the display surface; and a plurality of intermediate bases disposed between the central base and the end base in the first direction, and
a width in the first direction of one of the plurality of intermediate bases is larger than a width in the first direction of the central base.

2. The display device according to claim 1, wherein the width in the first direction of one of the plurality of intermediate bases is larger than a width in the first direction of the end base.

3. The display device according to claim 2, wherein in the plurality of intermediate bases, the width in the first direction becomes narrower toward the center in the first direction of the display surface, and the width in the first direction becomes narrower toward the end of the display surface.

4. The display device according to claim 3, wherein with respect to a width in the first direction of each of the plurality of bases, a rate of a change in width from one of the plurality of intermediate bases in which the width in the first direction is widest to the end base is larger than a rate of a change in width from one of the plurality of intermediate bases in which the width is widest to the central base.

5. The display device according to claim 1, wherein the width in the first direction of the central base and the width in the first direction of the end base are equal to each other.

6. The display device according to claim 1, wherein widths in a second direction of the plurality of bases are equal to each other, the second direction different from the first direction.

7. The display device according to claim 1, wherein
the first substrate further includes: a plurality of thin film transistors arranged at intersections of the plurality of gate lines and the plurality of data lines; a plurality of pixel electrodes; and a common electrode, and
each of the plurality of bases is formed in a region where at least the gate line, a semiconductor layer constituting the thin film transistor, the data line, and the common electrode are overlapped one another in plan view.

8. The display device according to claim 1, wherein
the first substrate further includes: a plurality of thin film transistors arranged at intersections of the plurality of gate lines and the plurality of data lines; a plurality of pixel electrodes; a common electrode; and a plurality of common wirings through which a common voltage is supplied to the common electrode, and
each of the plurality of bases is formed in a region where at least the gate line, a semiconductor layer constituting the thin film transistor, the data line, the common electrode, and the common wiring overlap one another in plan view.

9. The display device according to claim 1, wherein
the second substrate further includes: a plurality of light transmission units that transmit light; and a light shielding unit that is formed around each of the plurality of light transmission units to block light transmission,
the light shielding unit includes: a plurality of first light shielding portions extending in the first direction; and a plurality of second light shielding portions extending in a second direction different from the first direction,
the plurality of second light shielding portions include: a central light shielding portion disposed on the center in the first direction of the display surface; an end light shielding portion disposed on the end in the first direction of the display surface; and an intermediate light shielding portion disposed between the central light shielding portion and the end light shielding portion, and
a width in the first direction of the intermediate light shielding portion is larger than a width in the first direction of the central light shielding portion, and is larger than the width in the first direction of the end light shielding portion.

10. A display device including a curved display surface, the display device comprising:
a first substrate bent in a first direction;
a second substrate that is bent in the first direction and disposed opposite the first substrate; and
a plurality of spacers disposed between the first substrate and the second substrate,
wherein the first substrate includes: a plurality of data lines; a plurality of gate lines; and a plurality of thin film transistors arranged at intersections of the plurality of data lines and the plurality of gate lines,
the plurality of spacers include: a central spacer disposed on a center in the first direction of the display surface; an end spacer disposed on an end in the first direction of the display surface; and an intermediate spacer disposed between the central spacer and the end spacer,
the plurality of thin film transistors include: a central thin film transistor opposed to the central spacer; an end thin film transistor opposed to the end spacer; and an intermediate thin film transistor opposed to the intermediate spacer, and
a width in the first direction of a semiconductor layer constituting the intermediate thin film transistor is larger than a width in the first direction of a semiconductor layer constituting the central thin film transistor.

11. A display device including a curved display surface, the display device comprising:
a first substrate bent in a first direction;
a second substrate that is bent in the first direction and disposed opposite the first substrate; and
a plurality of spacers disposed between the first substrate and the second substrate,
wherein the first substrate includes: a plurality of first wirings that are one of a plurality of data lines and a plurality of gate lines, the plurality of first wirings extending in the first direction; and a plurality of second wirings that are the other of the plurality of data lines and the plurality of gate lines, the plurality of second wirings extending in a second direction orthogonal to the first direction,
the plurality of spacers include: a central spacer disposed on a center in the first direction of the display surface; an end spacer disposed on an end in the first direction of the display surface; and an intermediate spacer disposed between the central spacer and the end spacer, and
a width in the first direction of the second wiring opposed to the intermediate spacer is larger than a width in the first direction of the second wiring opposed to the central spacer.

12. The display device according to claim 11, wherein
the first substrate further includes a plurality of thin film
transistors arranged at intersections of the plurality of
data lines and the plurality of gate lines,
the plurality of thin film transistors include: a central thin film transistor electrically connected to the second wiring opposed to the central spacer; and an intermediate thin film transistor electrically connected to the second wiring opposed to the intermediate spacer, and
a channel length of the intermediate thin film transistor is longer than a channel length of the central thin film transistor.

* * * * *